(12) United States Patent
Haga et al.

(10) Patent No.: US 12,512,430 B2
(45) Date of Patent: Dec. 30, 2025

(54) METALLIZATION METHOD

(71) Applicants: Rohm and Haas Electronic Materials LLC, Marlborough, MA (US); DDP Specialty Products Taiwan Co., Ltd., Taipei (TW)

(72) Inventors: Mitsuru Haga, Niigata (JP); Ching-Lung Chen, Miaoli (TW)

(73) Assignees: DUPONT ELECTRONIC MATERIALS INTERNATIONAL, LLC, Marlborough, MA (US); DDP SPECIALTY PRODUCTS TAIWAN CO., LTD., Taipei (TW)

( * ) Notice: Subject to any disclaimer, the term of this patent is extended or adjusted under 35 U.S.C. 154(b) by 723 days.

(21) Appl. No.: 17/851,413

(22) Filed: Jun. 28, 2022

(65) Prior Publication Data
US 2023/0420401 A1    Dec. 28, 2023

(51) Int. Cl.
*G03F 7/00* (2006.01)
*G03F 7/20* (2006.01)
(Continued)

(52) U.S. Cl.
CPC ............... *H01L 24/11* (2013.01); *G03F 7/20* (2013.01); *G03F 7/30* (2013.01); *H01L 2224/11462* (2013.01); *H01L 2224/11622* (2013.01)

(58) Field of Classification Search
CPC .................................................. G03F 7/004–18
See application file for complete search history.

(56) References Cited

U.S. PATENT DOCUMENTS

| | | |
|---|---|---|
| 5,492,793 A | 2/1996 | Breyta et al. |
| 5,843,624 A | 12/1998 | Houlihan et al. |

(Continued)

FOREIGN PATENT DOCUMENTS

| | | |
|---|---|---|
| EP | 0930542 A1 | 7/1999 |
| EP | 1008913 A1 | 6/2000 |

(Continued)

OTHER PUBLICATIONS

Chabal et al.; "Surface Composition and Morphology"; Materials Science; DOI:10.1016/B978-081551554-8.50012-4; Dec. 2008, pp. 568-618.

(Continued)

*Primary Examiner* — Cachet I Proctor
(74) *Attorney, Agent, or Firm* — CANTOR COLBURN LLP

(57) ABSTRACT

Disclosed herein is a metallization method, comprising (a) forming on a first surface of a substrate an underlayer from an underlayer composition comprising: a first polymer comprising an acid-labile group, and a sensitizing group, wherein (i) the first polymer comprises the sensitizing group or (ii) a compound that is distinct from the first polymer comprises the sensitizing group; wherein the underlayer has a first thickness; (b) forming on the underlayer a photoresist layer from a photoresist composition comprising: a second polymer comprising an acid-labile group, and a photoacid generator; wherein the photoresist layer has a second thickness; (c) pattern-wise exposing the photoresist layer to activating radiation; (d) developing the exposed photoresist layer with a basic developer.

8 Claims, 9 Drawing Sheets

(51) Int. Cl.
*G03F 7/30* (2006.01)
*H01L 23/00* (2006.01)

(56) References Cited

U.S. PATENT DOCUMENTS

| | | | |
|---|---|---|---|
| 5,929,176 | A | 7/1999 | Kim et al. |
| 6,042,997 | A | 3/2000 | Barclay et al. |
| 6,048,662 | A | 4/2000 | Bruhnke et al. |
| 6,048,664 | A | 4/2000 | Houlihan et al. |
| 6,057,083 | A | 5/2000 | Taylor et al. |
| 6,090,526 | A | 7/2000 | Kumar |
| 6,136,501 | A | 10/2000 | Trefonas, III et al. |
| 6,306,554 | B1 | 10/2001 | Barclay et al. |
| 6,680,159 | B2 | 1/2004 | Barclay et al. |
| 6,692,888 | B1 | 2/2004 | Barclay et al. |
| 7,244,542 | B2 | 7/2007 | Bae et al. |
| 7,582,412 | B2 * | 9/2009 | Cameron ............... G03F 7/0755 430/311 |
| 8,206,886 | B2 | 6/2012 | Kodama |
| 2003/0215736 | A1 | 11/2003 | Oberlander et al. |
| 2008/0199814 | A1 * | 8/2008 | Brzozowy ............... G03F 7/095 430/312 |
| 2010/0297556 | A1 | 11/2010 | Cameron et al. |
| 2010/0297557 | A1 | 11/2010 | Cameron et al. |
| 2011/0003250 | A1 | 1/2011 | Amara et al. |
| 2012/0064456 | A1 | 3/2012 | Bae et al. |
| 2013/0087529 | A1 * | 4/2013 | Hatakeyama ..... H01L 21/31138 528/370 |
| 2013/0157196 | A1 | 6/2013 | Shigemasa et al. |
| 2014/0087311 | A1 | 3/2014 | Nakasugi et al. |
| 2017/0108776 | A1 | 4/2017 | Cameron et al. |
| 2017/0219921 | A1 | 8/2017 | O'Toole et al. |
| 2018/0188648 | A1 | 7/2018 | Haga et al. |
| 2018/0321585 | A1 * | 11/2018 | Kinoshita ......... C08F 220/1808 |
| 2019/0129306 | A1 * | 5/2019 | Jo ........................... G03F 7/094 |
| 2022/0019141 | A1 | 1/2022 | Liu et al. |
| 2022/0035246 | A1 | 2/2022 | Nishiguchi et al. |
| 2022/0137506 | A1 * | 5/2022 | Marangoni ........... G03F 7/0392 |

FOREIGN PATENT DOCUMENTS

| | | | |
|---|---|---|---|
| JP | H08286384 | A | 11/1996 |
| JP | 10111563 | A | 4/1998 |
| JP | 2004271838 | A * | 9/2004 |
| JP | 4318944 | B2 | 8/2009 |
| JP | 4318945 | B2 | 8/2009 |
| JP | 2014106306 | A * | 6/2014 |
| JP | 6147995 | B2 | 6/2017 |
| KR | 20140067904 | A | 6/2014 |
| WO | 0186353 | A1 | 11/2001 |
| WO | 02069039 | A2 | 9/2002 |
| WO | 2011086997 | A1 | 7/2011 |

OTHER PUBLICATIONS

Crivello et al.; "Anthracene electron-transfer photosensitizers for onium salt induced cationic photopolymerizations"; Journal of Photochemistry and Photobiology A: Chemistry 159; Jan. 24, 2003, pp. 173-188.

Huang et al.; "Intermetallic Formation of Copper Pillar With Sn—Ag—Cu for Flip-Chip-on-Module Packaging"; IEEE Transactions on Components and Packaging Technologies; vol. 31, No. 4; Dec. 2008, p. 767-775.

Luo et al; "Method to Improve the Process Efficiency for Copper Pillar Electroplating"; Journal of The Electrochemical Society, 163 (3); Dec. 2015; pp. E39-E42.

Nair et al.; "Sputtered Ti—Cu as a Superior Barrier and Seed Layer for Panel-based High-Density RDL Wiring Structures"; 2015 Electronic Components & Technology Conference; May 2015, pp. 2248-2253.

Onozeki et al.; "Study of Fine Pitch Rdl First FO-PLP/WLP"; Proceedings of the International Wafer-Level Packaging Conference 2018; Downloaded on May 11, 2021 at 03:34:54 UTC from IEEE Xplore; 7 pages.

* cited by examiner

Table 7

| Examples | Ex-1 | Ex-2 | Ex-3 | Ex-4 |
|---|---|---|---|---|
| UL Name | UL-1 | UL-1 | UL-1 | UL-1 |
| Polymer of UL | UL-A1/UL-A2 | UL-A1/UL-A2 | UL-A1/UL-A2 | UL-A1/UL-A2 |
| PAG in UL | P1 | P1 | P1 | P1 |
| Bake UL [°C] | 185 | 170 | 200 | 185 |
| UL Thickness [nm] | 54 | 54 | 54 | 54 |
| PR Name | PR-1 | PR-1 | PR-1 | PR-1 |
| Polymer of PR | D | D | D | D |
| PAG in PR | P2 | P2 | P2 | P2 |
| Exposure | 271msec | 283msec | 283msec | 238msec |
| Cross Section Profile 1.5μm Dense Trenches | | | | |
| Magnified at Bottom | | | | |
| Bottom Profile | Undercut | Undercut | Undercut | Undercut |
| Undercut Width/Height | 0.2/0.5μm | 0.3/0.7μm | 0.3/0.8μm | 0.2/0.4μm |

FIG. 2

Table 8

| | Ex-5 | Ex-6 | Ex-7 | Ex-8 |
|---|---|---|---|---|
| UL Name | UL2 | UL3 | UL4 | UL5 |
| Polymer of UL | UL-A1 | UL-A2 | UL-A1 | UL-A3 |
| PAG in UL | None | None | None | None |
| Bake UL [°C] | 185 | 185 | 185 | 185 |
| UL Thickness [nm] | 54 | 54 | 110 | 54 |
| PR Name | PR-1 | PR-1 | PR-1 | PR-1 |
| Polymer of PR | D | D | D | D |
| PAG in PR | P2 | P2 | P2 | P2 |
| Exposure | 271msec | 271msec | 271msec | 239msec |
| Cross Section Profile 1.5μm Dense Trenches | | | | |
| Magnified at Bottom | | | | |
| Bottom Profile | Undercut | Undercut | Undercut | Undercut |
| Undercut Width/Height | 0.2/0.5μm | 0.3/0.5μm | 0.2/0.5μm | 0.2/2.2μm |

FIG. 3

Table 9

| | Ex-9 | Ex-10 | Ex-11 | Ex-12 |
|---|---|---|---|---|
| UL Name | UL-1 | UL-1 | UL-1 | UL-1 |
| Polymer of UL | UL-A1/UL-A2 | UL-A1/UL-A2 | UL-A1/UL-A2 | UL-A1/UL-A2 |
| PAG in UL | P1 | P1 | P1 | P1 |
| Bake UL [°C] | 185 | 185 | 185 | 185 |
| FT UL [nm] | 54 | 54 | 54 | 54 |
| PR Name | PR-2 | PR-3 | PR-4 | PR-5 |
| Polymer of PR | E | F | G | D |
| PAG in PR | P2 | P2 | P2 | P3 |
| Exposure | 315 msec | 450 msec | 211 msec | 293 msec |
| Cross Section Profile 1.5μm Dense Trenches | | | | |
| Magnified at Bottom | | | | |
| Bottom Profile | Undercut | Undercut | Undercut | Undercut |
| Undercut Width/Height | 0.3/0.4μm | 0.3/3.2μm | 0.2/0.6μm | 0.1/2.5μm |

FIG. 4

Table 11

| | CF-1 | CF-2 | CF-3 |
|---|---|---|---|
| UL Name | None | None | None |
| Polymer of UL | ---- | ---- | ---- |
| PAG in UL | ---- | ---- | ---- |
| Bake UL [°C] | ---- | ---- | ---- |
| UL Thickness [nm] | ---- | ---- | ---- |
| PR Name | PR-6 | PR-4 | PR-1 |
| Polymer of PR | H | G | D |
| PAG in PR | P2 | P2 | P2 |
| Exposure | 282msec | 190msec | 220msec |
| Cross Section Profile 1.5μm Dense Trenches | | | |
| Magnified at Bottom | | | |
| Bottom Profile | Footing | Footing | Footing |
| Undercut Width/Height | NA | NA | NA |

FIG. 6

Table 12

| | EX-14 | CF-4 |
|---|---|---|
| UL Name | UL-1 | UL-7 |
| Polymer of UL | A/B | Resin-1 |
| PAG in UL | P-1 | PAC-1 |
| Bake UL [°C] | 185 | 135 |
| FT UL [nm] | 54 | 70 |
| PR Name | PR-1 | PR-1 |
| Polymer of PR | D | D |
| PAG in PR | P2 | P2 |
| Exposure | 230msec | 250msec |
| Cross Section Profile 1.5μm Isolated Trenches | | |
| Magnified at Bottom | | |
| Bottom Profile | Undercut | Footing |
| Undercut Width/Height | 0.6/0.7μm | NA |

FIG. 7

METALLIZATION METHOD

BACKGROUND

This disclosure relates to a patterning process for manufacturing semiconductors. In particular, this disclosure relates to a patterning process for manufacturing semiconductors that prevents the development of a footing profile in a photoresist pattern.

Mobile devices, devices that are part of the internet of things (IoT) and wearable electronics have over the years become smaller, lighter and thinner devices that despite increasing miniaturization use larger amounts of memory and perform increasingly larger amounts of computation.

The manufacture and packaging of these electronic devices serves an important role in the size reduction. For example, flip-chip packaging methods have been used to increase the density of I/O (Input/Output) connections between devices, especially for micro-processing unit (MPU) and dynamic random-access memory (DRAM) semiconductor chips.

Metal pillar bumps such as, for example, copper pillar bumps are often used as a flip chip interconnect for use in electronics and optoelectronic packaging, including: flip chip packaging of CPU and GPU integrated circuits (chips), laser diodes, and semiconductor optical amplifiers (SOA). Metal pillar bumps provide beneficial connection resistance, high-density connections, metal migration resistance, and thermal dissipation properties. Metal line patterns may also used, for example in a re-distribution layer (RDL), for providing electrical connection between two components.

Electroplating been used for the fabrication of metal pillar bump arrays and line patterns. A photoresist layer is coated on a copper film surface and a mask pattern is then manufactured using photolithography. Metal structures are then formed on the metal surface by electroplating in open areas of the mask pattern. The photoresist is then removed and the metal layer that was previously covered by the resist is removed by etching.

One approach to the preparation of plating mask patterns is the use of thick photoresist layers to respond to the need for thicker and narrower pattern sizes for further increases in I/O and device density. Chemically amplified photoresists may be a suitable option for achieving the faster sensitivity and improved transparency desired for higher resolution patterns. Such resist compositions include a polymer having acid labile groups, a photoacid generator (PAG), and a solvent. However, when chemically amplified resists are formed on a metal layer, such as a copper layer, footing profile issues have been observed due to loss of photoacid present at the interface between the metal surface and the resist.

The footing in the resist pattern results in an undercut profile in the plated pattern. This can promote collapse of the plated patterns during downstream processing. Thus, it is desired that footing of photoresist patterns used as plating masks is eliminated and an undercut resist pattern profile is provided to overcome the collapse of plated patterns.

SUMMARY

Disclosed herein is a metallization method, comprising (a) forming on a first surface of a substrate an underlayer from an underlayer composition comprising: a first polymer comprising an acid-labile group, and a sensitizing group, wherein (i) the first polymer comprises the sensitizing group or (ii) a compound that is distinct from the first polymer comprises the sensitizing group; wherein the underlayer has a first thickness; (b) forming on the underlayer a photoresist layer from a photoresist composition comprising: a second polymer comprising an acid-labile group, and a photoacid generator; wherein the photoresist layer has a second thickness; (c) pattern-wise exposing the photoresist layer to activating radiation; (d) developing the exposed photoresist layer with a basic developer, thereby removing portions of the photoresist layer and portions of the underlayer to form a relief pattern, wherein the relief pattern has an undercut profile at the first surface, wherein a maximum height of an undercut in the relief pattern measured from the first surface is greater than the first thickness; and (e) after forming the relief pattern, plating a metal on the first surface of the substrate.

BRIEF DESCRIPTION OF THE FIGURES

FIGS. 2-7 depicts the Tables 7-12 respectively, which include data from working examples.

DETAILED DESCRIPTION

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise.

As used herein, an "acid-labile group" refers to a group in which a bond is cleaved by the catalytic action of an acid, optionally and typically with thermal treatment, resulting in a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

Disclosed herein is a method for manufacturing semiconductors that minimizes the occurrence of footing during the manufacturing process. As noted above, footing causes an undercut of a plated pattern which may promote a collapsing of the plated pattern during further process and reliability testing. It is therefore desirable to eliminate or to remove footing of the plated pattern. The method comprises forming on a first surface of a substrate an underlayer having a first thickness from an underlayer composition. A photoresist layer having a second thickness is then formed on the underlayer and then patterned by subjecting it to activating radiation. The exposed photoresist layer is then developed with a basic developer, thereby removing portions of the photoresist layer and portions of the underlayer to form a relief pattern. The relief pattern has an undercut profile at the first surface. In an embodiment, a maximum height of the undercut in the relief pattern measured from the first surface is greater than the first thickness. A metal may be plated on the first surface of the substrate after forming the relief pattern.

Figure 1A:
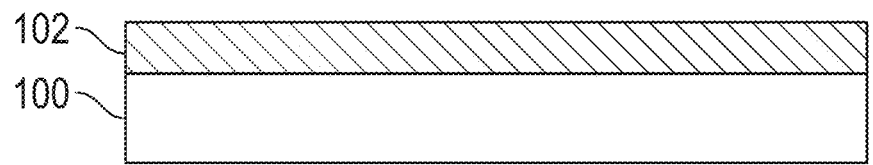
FIG. 1A depicts an exemplary embodiment of the substrate upon which at first metal layer is disposed.
Figure 1B:
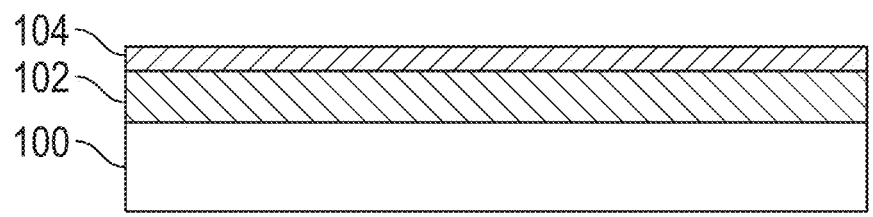
FIG. 1B depicts an exemplary embodiment of the deposition of the underlayer on the first metal layer.
Figure 1C:
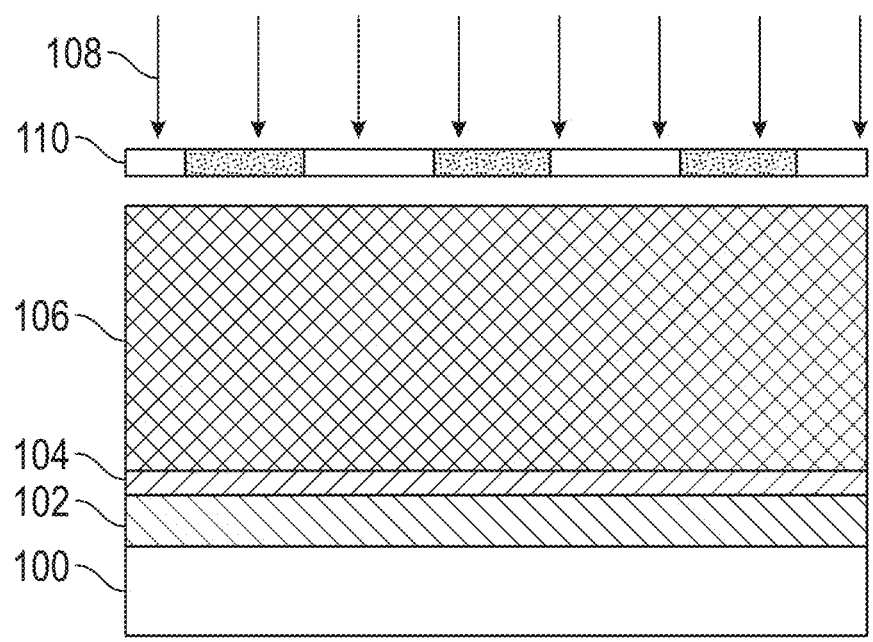
FIG. 1C depicts an exemplary embodiment of the deposition of the photoresist layer on the underlayer and the photopatterning of the photoresist layer and the underlayer.
Figure 1D:
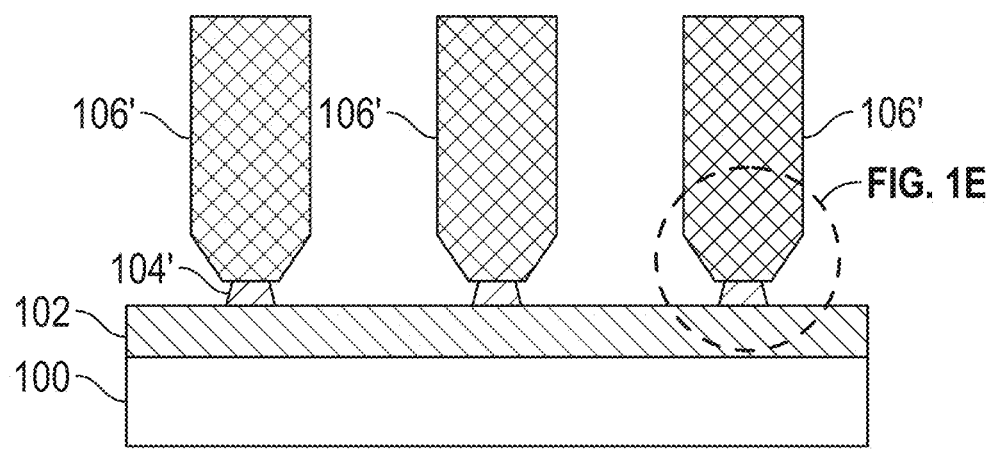
FIG. 1D depicts an exemplary embodiment of the development of the photoresist layer and the underlayer.
Figure 1E:
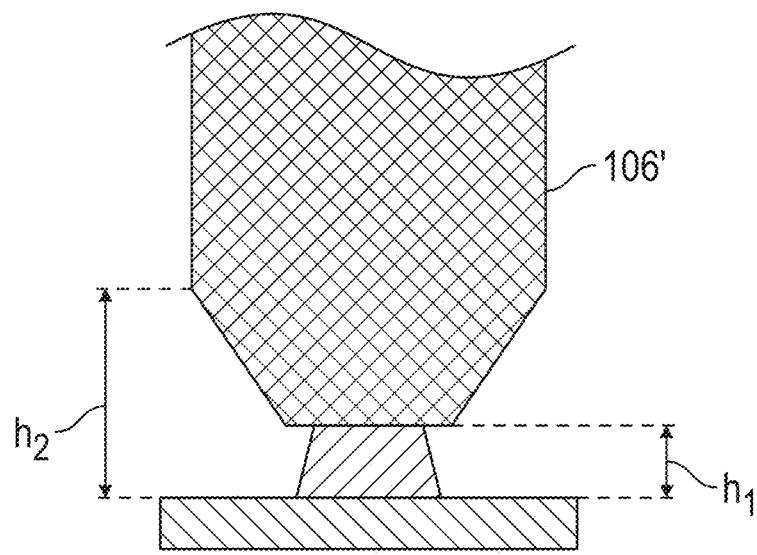
FIG. 1E depicts an expanded view of section AA from the FIG. 1D. The expanded view depicts an undercut that occurs in the photoresist layer and the underlayer.

FIGS. 1A-1G depict a method of forming a plated pattern on a substrate. FIG. 1A depicts the substrate 100 upon which at first metal layer 102 is disposed. FIG. 1B depicts the coating of the underlayer 104 on the first metal layer 102. FIG. 1C depicts the coating of the photoresist layer 106 on the underlayer 104 followed by photo-exposure of the photoresist layer 106 and the underlayer 104. FIG. 1D depicts the development of the exposed parts of the photoresist layer and the underlayer. FIG. 1E is a depiction of an enlarged view of the dashed section from the FIG. 1D.

FIG. 1C depicts the coating of the photoresist layer 106. The photoresist layer 106 comprises a photoacid generator and a second polymer that contains an acid labile group. After coating the photoresist layer 106, the photoresist layer 106 and underlayer 104 are patternwise exposed to activating radiation 108 through a photomask 110 having optically opaque and optically transparent regions. A UV light having a wavelength of 10 to 400 nanometers may be used in the photopatterning. The exposed portions of the photoresist layer 106 and the underlayer 104 are removed via development as seen in the FIG. 1D. FIG. 1E represents an enlarged view of the dashed section of the FIG. 1D. FIG. 1E depicts the thickness of the underlayer "$h_1$" and the undercut of height "$h_2$" in the photoresist and the underlayer. The height $h_2$ is measured from an upper surface of the first metal layer 102. The undercut height $h_2$ is greater than a thickness of the underlayer $h_1$ (also measured from the upper surface of the first metal layer 102).

The various layers (depicted in the FIGS. 1A-1E) and their respective compositions described above will now be described in detail.

The Substrate

Examples of the substrate include, but are not limited to, silicon wafers, glass substrates and plastic substrates, such substrates optionally including one or more layers or features formed thereon. A preferred substrate is a silicon wafer.

The Metal Layer

FIG. 1A depicts the substrate 100 upon which at first metal layer 102 is disposed. An optional second metal layer (not shown) may be disposed on the first metal layer 102. The first metal layer can be made, for example, of titanium, silver, aluminum, gold, copper, or an alloy thereof. In an exemplary embodiment, the first metal layer 102 comprises titanium or copper. When a second metal layer is disposed on the first metal layer, the first metal layer preferably comprises titanium. The metal first layer can be formed using known methods, for example, by chemical vapor deposition (CVD), plasma enhanced chemical vapor deposition (PECVD) or physical vapor deposition (PVD) techniques, with sputtering and plating being typical. The thickness of the first metal layer 102 is typically from 10 nm to 500 nm.

The optional second metal layer comprises tantalum, titanium, copper, silver, aluminum, gold, or an alloy thereof. The second metal layer is chemically different from the first metal layer 102. In an exemplary embodiment, the second metal layer comprises copper. The second metal layer may be disposed on the surface of the first metal layer via chemical vapor deposition (CVD), plasma enhanced chemical vapor deposition (PECVD), physical vapor deposition (PVD), or a combination thereof. The thickness of the second metal layer is typically from 10 nm to 500 nm.

The Underlayer

FIG. 1B depicts the deposition of the underlayer 104 on the first metal layer 102. In one embodiment, the underlayer 104 is manufactured from an underlayer composition that comprises a first polymer that comprises an acid-labile group and a sensitizing group, and a solvent. The first polymer is typically a copolymer that comprises first repeat units that comprise an acid-labile group and second repeat units that comprise a sensitizing group. The acid-labile group and sensitizing group can be present in the same repeating unit of the polymer. The underlayer composition typically does not contain a photoacid generator (PAG).

In another embodiment, the underlayer composition comprises a compound that contains a sensitizing group and a first polymer that comprises an acid-labile group. In this embodiment, the compound that comprises the sensitizing group is distinct from the first polymer. The compound may that comprises the sensitizing group may be a polymer that is blended with the first polymer that comprises the acid-labile group. In another embodiment, the compound that comprises the sensitizing group may not be a polymer but rather may be a small molecule. The small molecule may be, for example, in the form of a monomer or dimer or may be in non-polymerizable form.

Since the underlayer 104 comprises the sensitizing group, it functions as a sensitizing layer to localize or increase photoacid concentration at the interface between the underlayer and the photoresist layer. As a result, a thick underlayer is not desirable. It is desirable to use a higher temperature to bake the underlayer when compared with the temperature at which the photoresist layer is baked at as this will prevent intermixing of the two layers. In an embodiment, the sensitizing group of the underlayer composition is bonded to a polymer to prevent sublimation at the higher bake temperatures.

The acid labile group in the underlayer facilitates positive tone patterning. The underlayer typically does not contain a photoacid generator. If a photoacid generator is optionally added to the underlayer composition, the thermal stability of the photoacid generator may need be higher than the bake temperature used (for baking the underlayer) to prevent unwanted thermal decomposition.

The acid labile group is a chemical moiety that undergoes a deprotection reaction in the presence of an acid. Deprotection of some acid labile groups that are used in the examples are brought on by heat. Acetal protection groups readily undergo deprotection at room temperature. The first polymer of the underlayer composition undergoes a change in solubility in a developer as a result of reaction with acid generated from the photoacid generator (included in the photoresist composition) following soft bake, exposure to activating radiation and post exposure bake. This results from photoacid-induced cleavage of the acid labile group causing a change in polarity of the first polymer. The acid labile group can be chosen, for example, from tertiary alkyl carbonates, tertiary alkyl esters, tertiary alkyl ethers, acetals and ketals. Preferably, the acid labile group is an ester group that contains a tertiary non-cyclic alkyl carbon or a tertiary alicyclic carbon covalently linked to a carboxyl oxygen of an ester of the first polymer. The cleavage of such acid labile groups results in the formation of carboxylic acid groups.

In one embodiment, the first polymer that comprises the acid-labile group includes polymerized units having the structure shown in formula (1) below:

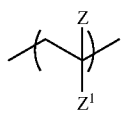

(1)

wherein Z is selected from a hydrogen atom, substituted or unsubstituted $C_1$-$C_4$ alkyl, substituted or unsubstituted $C_1$-$C_4$ fluoroalkyl or a cyano group; $Z^1$ is a non-hydrogen substituent comprising an acid-labile group, the cleavage of which forms a carboxylic acid on the polymer.

In an embodiment, the acid-labile group which, on decomposition, forms a carboxylic acid group on the polymer is preferably a tertiary ester group of the formula —C(O)OC($R^1$)$_3$ or an acetal group of the formula —C(O)OC($R^2$)$_2$O$R^3$, wherein: $R^1$ is each independently linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_6$-20 aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, each R 1 optionally including as part of its structure one or more groups chosen from —O—, —C(O)—, —C(O)—O—, or —S—, and any two $R^1$ groups together optionally forming a ring; R 2 is independently hydrogen, fluorine, linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_6$-20 aryl, or monocyclic or polycyclic $C_{2-20}$ heteroaryl, preferably hydrogen, linear $C_{1-6}$ alkyl, branched $C_{3-6}$ alkyl, or monocyclic or polycyclic $C_{3-10}$ cycloalkyl, each of which is substituted or unsubstituted, each $R^2$ optionally including as part of its structure one or more groups chosen from —O—, —C(O)—, —C(O)—O—, or —S—, and the $R^2$ groups together optionally forming a ring; and $R^3$ is linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_6$-20 aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, $R^3$ optionally including as part of its structure one or more groups chosen from —O—, —C(O)—, —C(O)—O—, or —S—, and one $R^2$ together with $R^3$ optionally forming a ring. Such monomer is typically a vinyl aromatic, (meth)acrylate, or norbornyl monomer.

Suitable acid labile-group containing units include, for example, acid-labile (alkyl)acrylate units, such as t-butyl (meth)acrylate, 1-methylcyclopentyl (meth)acrylate, 1-ethylcyclopentyl (meth)acrylate, 1-isopropylcyclopentyl (meth)acrylate, 1-propylcyclopentyl (meth)acrylate, 1-methylcyclohexyl (meth)acrylate, 1-ethylcyclohexyl (meth)acrylate, 1-isopropylcyclohexyl (meth)acrylate, 1-propylcyclohexyl (meth)acrylate, methyladamantyl(meth) acrylate, ethyladamantyl(meth)acrylate, and the like, and other cyclic, including alicyclic, and non-cyclic (alkyl) acrylates. Acetal and ketal acid labile groups can be substituted for the hydrogen atom at the terminal of an alkali-soluble group such as a carboxyl group so as to be bonded with an oxygen atom. When acid is generated, the acid cleaves the bond between the acetal or ketal group and the oxygen atom to which the acetal-type acid-dissociable, dissolution-inhibiting group is bonded. Exemplary such acid labile groups are described, for example, in U.S. Pat. Nos. 6,057,083, 6,136,501 and 8,206,886 and European Pat. Pub. Nos. EP01008913A1 and EP00930542A1. Also suitable are acetal and ketal groups as part of sugar derivative structures, the cleavage of which would result in the formation of hydroxyl groups, for example, those described in U.S. Patent Application No. US2012/0064456A1.

Suitable first polymers include, for example, phenolic resins that contain acid-labile groups. Particularly preferred resins of this class include: (i) polymers that contain polymerized units of a vinyl phenol and an acid labile (alkyl) acrylate as described above, such as polymers described in U.S. Pat. Nos. 6,042,997 and 5,492,793; (ii) polymers that contain polymerized units of a vinyl phenol, an optionally substituted vinyl phenyl (e.g., styrene) that does not contain a hydroxy or carboxy ring substituent, and an acid labile (alkyl) acrylate such as described above, such as polymers described in U.S. Pat. No. 6,042,997; (iii) polymers that contain repeat units that comprise an acetal or ketal moiety that will react with photoacid, and optionally aromatic repeat units such as phenyl or phenolic groups; such polymers described in U.S. Pat. Nos. 5,929,176 and 6,090,526, and blends of (i) and/or (ii) and/or (iii). Such polymers are useful for imaging at wavelengths, for example, of 200 nm or greater, such as 248 nm and 365 nm.

Suitable first polymers include those that are useful for imaging at certain sub-200 nm wavelengths such as 193 nm, such as those disclosed in European Patent Publication No. EP930542A1 and U.S. Pat. Nos. 6,692,888 and 6,680,159. For imaging at 193 nm wavelength, the polymers are preferably substantially free (e.g., less than 15 mole %), preferably completely free of phenyl, benzyl or other aromatic groups where such groups are highly absorbing of the radiation.

Other suitable polymers for use in the underlayer composition include, for example, those which contain polymerized units of a non-aromatic cyclic olefin (endocyclic double bond) such as an optionally substituted norbornene, for example, polymers described in U.S. Pat. Nos. 5,843,624 and 6,048,664. Still other suitable polymers for use in the underlayer composition include polymers that contain polymerized anhydride units, particularly polymerized maleic anhydride and/or itaconic anhydride units, such as disclosed in European Published Application EP01008913A1 and U.S. Pat. No. 6,048,662.

Also suitable for use in the underlayer composition is a first polymer that contains repeat units that contain a hetero atom, particularly oxygen and/or sulfur (but other than an anhydride, i.e., the unit does not contain a keto ring atom). The heteroalicyclic unit can be fused to the first polymer backbone and can comprise a fused carbon alicyclic unit such as provided by polymerization of a norbornene group and/or an anhydride unit such as provided by polymerization of a maleic anhydride or itaconic anhydride. Such first polymers are disclosed in International Pub. No. WO0186353A1 and U.S. Pat. No. 6,306,554. Other suitable hetero-atom group containing polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

The first polymer may further include a unit that contains a lactone moiety for controlling the dissolution rate of the polymer and the photoresist composition. Suitable monomers for use in the first polymer containing a lactone moiety include, for example, the following:

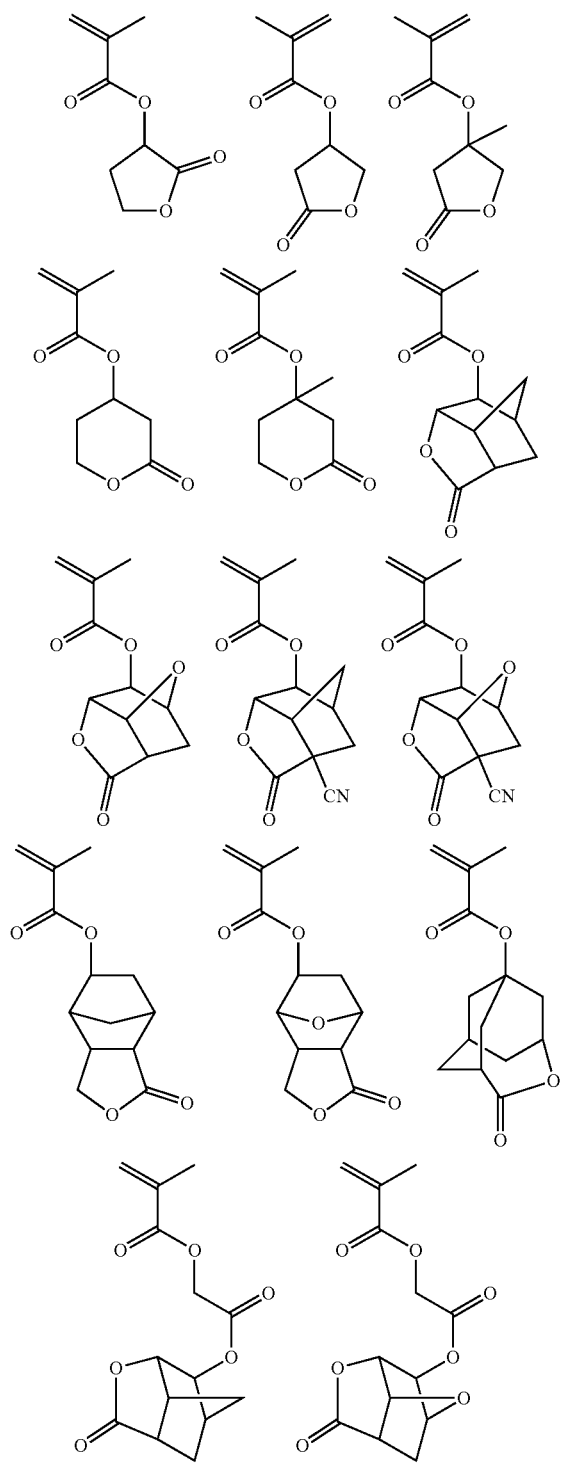

-continued

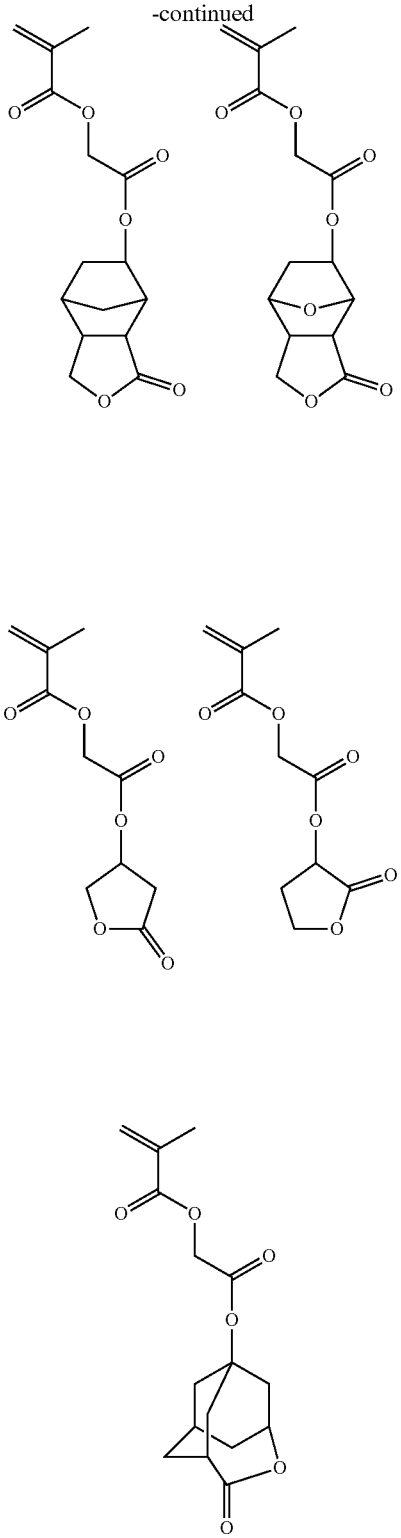

In an embodiment, the first polymer further typically includes a unit containing a polar group, which enhances etch resistance of the first polymer and photoresist composition and provides additional means to control the dissolution rate of the first polymer and photoresist composition. Monomers for forming such a unit include, for example, the following:

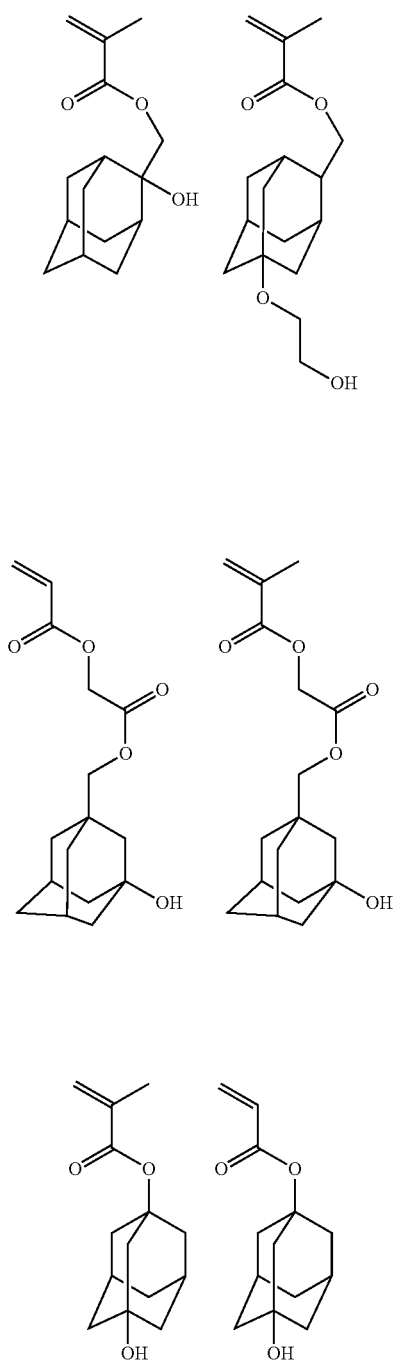
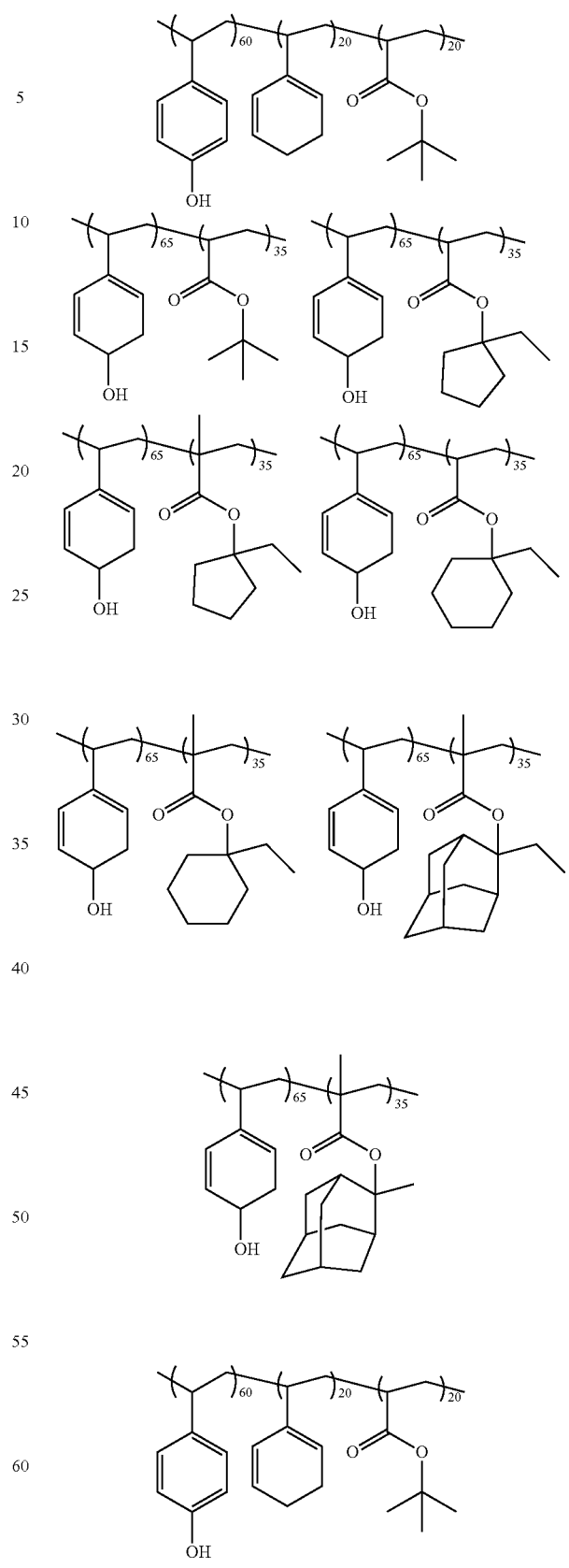

The first polymer can include one or more additional units of the types described above. Typically, the additional units for the first polymer will include the same or similar polymerizable group as those used for the monomers used to form the other units of the polymer, but may include other, different polymerizable groups in the same polymer backbone.

While not to be limited thereto, exemplary first polymers include, for example, the following:

Other exemplary copolymers that may be used as the first polymer include, for example, the following:

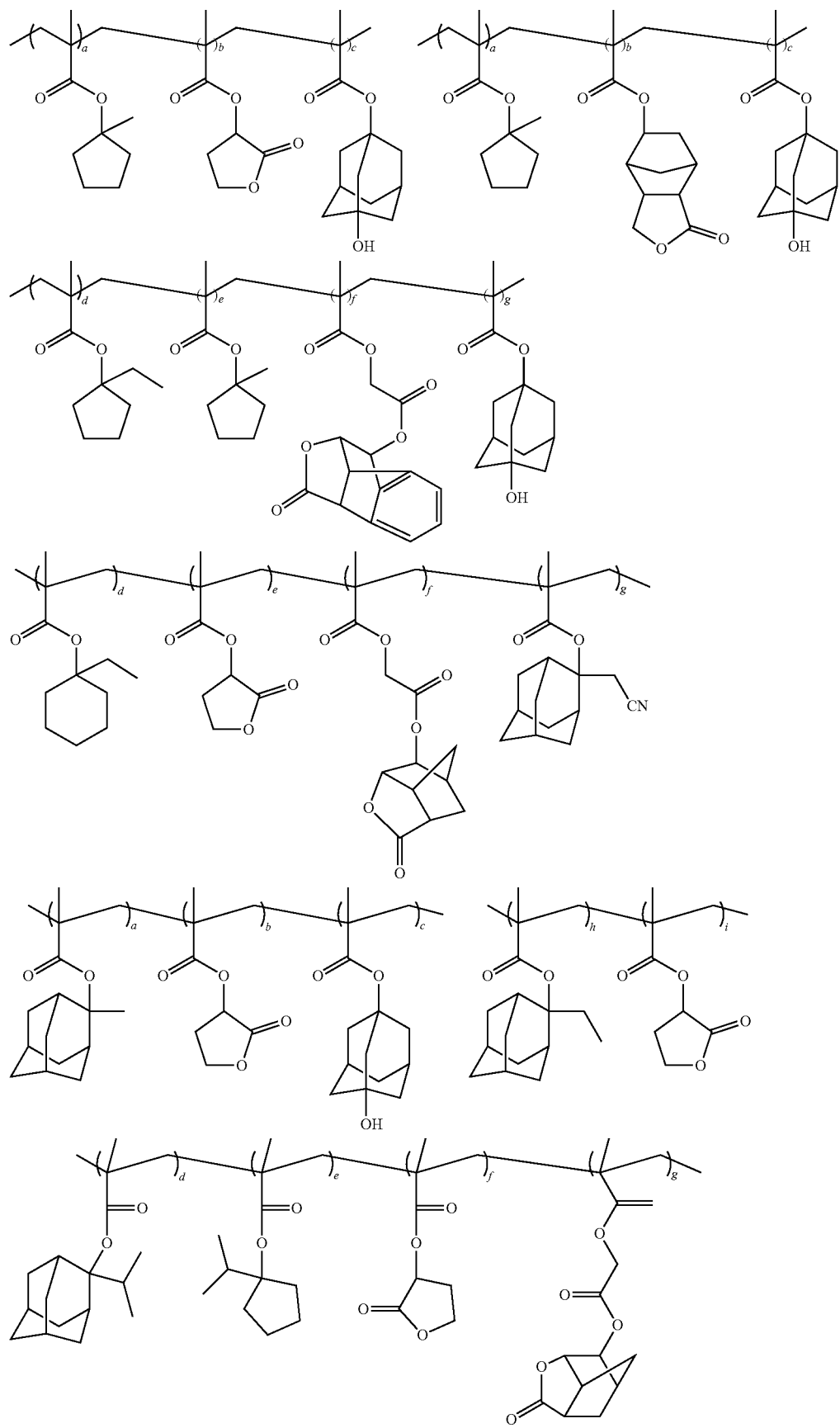

-continued

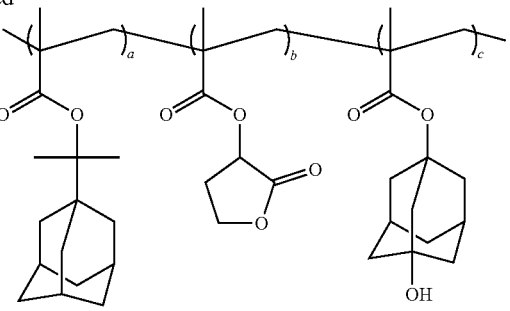

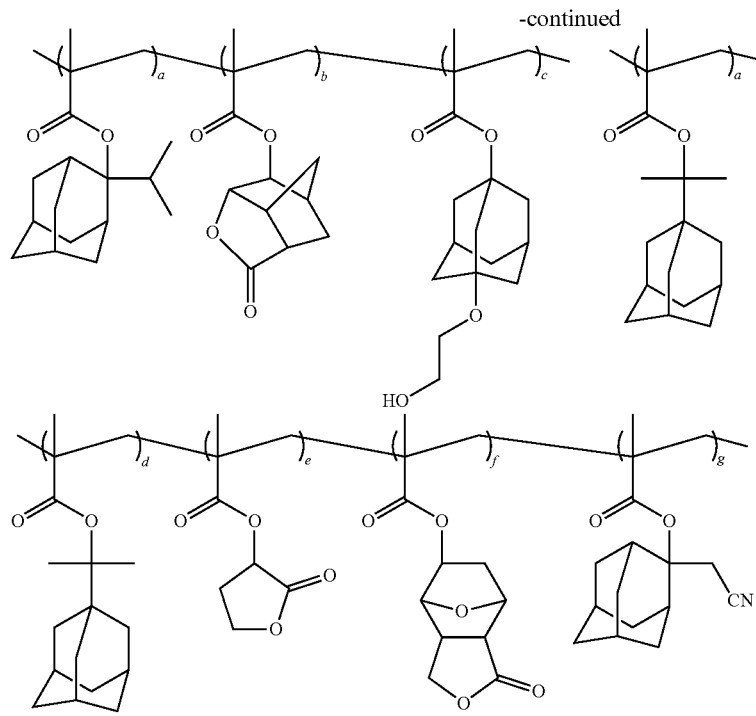

where a+b+c, d+e+f+g and h+i are equal to 100 mole % based on total polymerized units present in the first polymer.

Suitable first polymers for use in the underlayer compositions of the invention are commercially available and can readily be made by persons skilled in the art. The first polymer is present in the underlayer composition in an amount sufficient to render an exposed coating layer of the underlayer developable in a suitable developer solution.

Typically, the first polymer is present in the underlayer composition in an amount of from 70 to 100 wt % based on total solids of the underlayer composition. The weight average molecular weight $M_w$ of the first polymer is typically less than 100,000, for example, from 4000 to 100,000, more typically from 4000 to 20,000 grams per mole (g/mole) as measured by gel permeation chromatography using a polystyrene standard. Blends of two or more of the above-described first polymers can suitably be used in the underlayer composition of the invention.

As noted above, the underlayer composition comprises a sensitizing group that may be a separate chemical ingredient that is not covalently or ionically bonded to the first polymer. The sensitizing group may be bonded to "another polymer" that is present in the underlayer composition but that is not covalently or ionically bonded to the first polymer. This "another polymer" may be blended with the first polymer in the underlayer composition. In another embodiment, the sensitizing group may not be part of a polymer, but rather is present in the underlayer composition as a "small molecule" that is monomeric or dimeric.

The sensitizing group comprises molecules that affect the solubility of the resist if it is exposed to energetic radiation. In an embodiment, the sensitizing group is a polycyclic aromatic group. In an embodiment, the sensitizing group is an anthracene or an anthracene-derivative group.

In an embodiment, the first polymer (for use in the underlayer) further comprises a polymerized unit comprising a sensitizing group shown in formula (2) below:

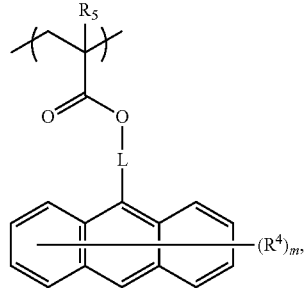

(2)

wherein L is a divalent linking group, where $R^5$ is as defined above and wherein each $R^4$ may be independently hydrogen, halogen (F, Cl, Br, I); substituted or unsubstituted alkyl preferably having 1 to about 12 carbon atoms; substituted or unsubstituted alkoxy preferably having 1 to about 12 carbon atoms; substituted or unsubstituted alkenyl preferably having 2 to about 12 carbon atoms; substituted or unsubstituted alkynyl preferably having 2 to about 12 carbon atoms; substituted or unsubstituted alkylthio preferably having 1 to about 12 carbon atoms; cyano; nitro; amino; hydroxyl; m is an integer of from 0 (where the anthracenyl ring is fully hydrogen-substituted) to 9. In an embodiment, m is preferably 0, 1 or 2. In a preferred embodiment in structure (2), L is an unsubstituted methylene group and m is 0.

A preferred sensitizer unit for use in the first polymer comprises the following structure:

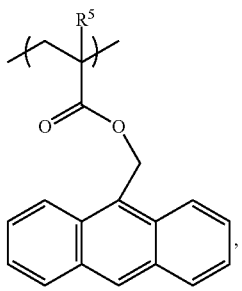

(3)

wherein $R^5$ is hydrogen or a methyl.

The sensitizer is typically present in the first polymer in an amount of 1 to 40 mole percent (mol %), typically 3 to 30 mol %, more typically 6 to 20 mol %, based on total number of moles of the first polymer. Typically, the sensitizer has a molecular weight of 5,000 to 15,000 g/mole.

The first polymer for use in the underlayer may also include one or more repeat units derived from a vinyl aromatic monomer, acrylic or methacrylic aromatic monomer that have phenolic hydroxyl group. An exemplary vinyl aromatic monomer is styrene. In an embodiment, the first polymer comprises a vinyl aromatic repeat unit having a structure chosen from one or both of formula (4) and (5) below:

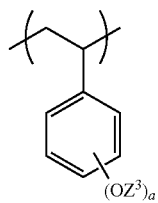

(4)

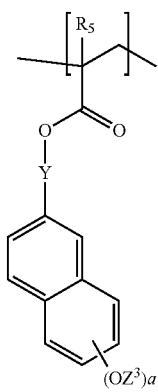

(5)

wherein a is 1 to 5 and where $Z^3$ is a hydrogen or an alkyl group having 1 to 5 carbon atoms. In a preferred embodiment, a is 1 and $Z^3$ is hydrogen. $R_5$ is hydrogen or methyl. Y is a divalent linker. It is preferable for the vinyl aromatic monomer to have a hydroxyl group located in the para-position on the aryl ring. A preferred first polymerized unit of the first polymer is poly(p-hydroxystyrene). The repeat units of formulas (4) and (5) will work as a dissolution promoter against alkaline developer.

The vinyl aromatic repeat unit is present in the first polymer in an amount of 30 to 90 mol %, typically 40 to 80 mol %, based on total number of repeat units in the first polymer.

In another embodiment, the first polymer may also contain a repeat unit that comprises a maleimide. The maleimide may prevent intermixing of the underlayer with the photoresist layer. In an embodiment, the first polymer may comprise a repeat unit obtained via a combination of a maleimide and a repeat unit of formula (3). This repeat unit has a structure of formula (6) and is obtained via a Diels Alder reaction.

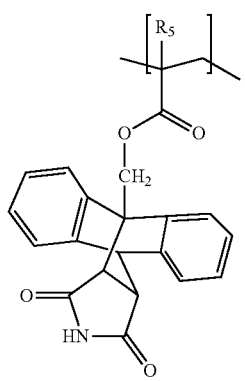

(6)

In an exemplary embodiment, the first polymer is a copolymer having the structure shown in formula (7)

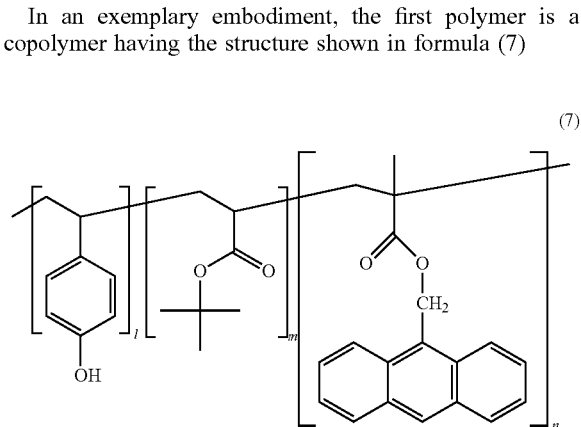

(7)

wherein l, m and n represent the molar percentage of each polymerized unit in the first polymer and add up to 100 mol %. In an embodiment, l is 40 to 75 mol %, m is 8 to 20 mol % and n is 5 to mol %, based on total moles of the copolymer. The total weight average molecular weight of the polymer of formula (7) is typically 5,000 to 15,000 g/mole, preferably 7,500 to 12,500 g/mole using a polystyrene standard.

In another exemplary embodiment, the first polymer is a copolymer having the structure shown in formula (8)

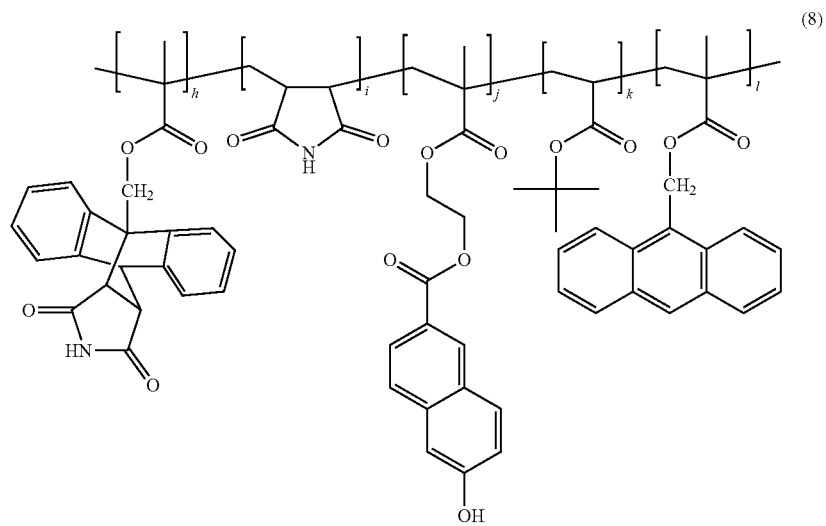

(8)

wherein h, i, j, k and l represent the molar percentage of each polymerized unit in the first polymer and add up to 100 mol %. In an embodiment, h is 10 to 40 mol %, i is 5 to 15 mol % and j is 30 to mol %, k is 5 to 15 mol %, l is 5 to 15 mol %, based on total moles of the copolymer. The total weight average molecular weight of the polymer of formula (8) is typically 5,000 to 20,000 g/mole, preferably 8,000 to 15,000 g/mole using a polystyrene standard.

As noted above, in an alternative embodiment, the underlayer composition may comprise a compound that contains a sensitizing group and a first polymer that comprises an acid-labile group. The sensitizing group is distinct from the first polymer.

In an embodiment, the sensitizing group may be a substituent on "another polymer" that is present in the underlayer composition, where this "another polymer" is distinct from the first polymer that comprises the acid labile group. The polymer containing the sensitizing group may be blended with the first polymer that contains the acid labile group. A compatibilizer such as, for example, a surfactant may be used to blend the first polymer with the "another polymer" that contains the sensitizing group. For example, the "another polymer" may be the polymer of formula (2) and may be blended with other exemplary polymers and copolymers shown above (that contain acid labile groups but do not contain the sensitizing group).

In another embodiment, the sensitizing group contained in the underlayer composition is not in the form of a polymer, but rather in the form of a small molecule (e.g., a monomer or a dimer, or a non-polymerizable small molecule). Preferred small molecule sensitizing groups are carbocyclic aryl or heteroaromatic materials that comprise 1, 2, 3 or 4 separate or fused aromatic rings. Heteroaromatic compounds typically contain 1 to about 3 N, O or S ring members and from 6 to 18 or more total ring members. Carbocyclic aryl sensitizer compounds also typically contain from 6 to 18 carbon ring atoms. Preferably, a sensitizer compound will have one or more electron-donating ring substituents, typically 1, 2, 3, 4 or 5 electron-donating ring substituents, such as, for example, optionally substituted alkyl preferably having 1 to about 20 carbon atoms, optionally substituted alkoxy preferably having 1 to about 20 carbon atoms, optionally substituted thioalkyl preferably having 1 to about 20 carbon atoms, optionally substituted thioalkoxy preferably having about 1 to 20 carbon atoms, hydroxy, optionally substituted thiohydroxyalkyl preferably having 1 to about 20 carbon atoms, or the like. Sensitizer compounds also may contain a linked separate or fused ring that are non-aromatic rings, such as a ring having from 3 to about 8 ring members, particularly cyclopentyl, cyclehexyl, thienyl, and the like.

Some preferred sensitizing groups for use in the underlayer composition include the following:

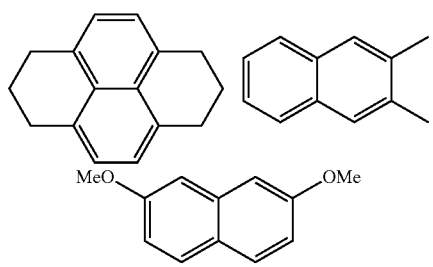

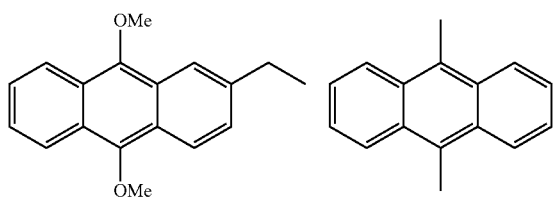

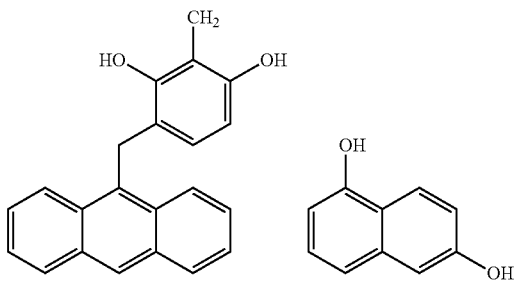

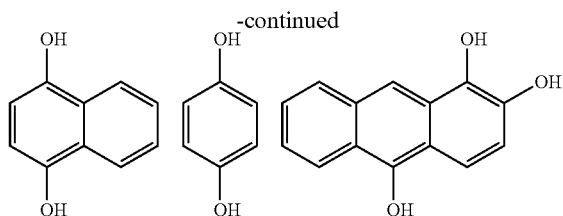

In an embodiment, the sensitizing group may comprise an anthracenyl moiety. Examples of sensitizing moieties that are present in the underlayer composition include anthracenyl moieties such as anthracene, anthracene maleimide, anthracene methyl acrylate, 9-anthrylmethyl acrylate (I), 9-anthrylmethyl methacrylate (II), 1'-(9-anthryl)ethyl acrylate (III), 1'-(9-anthryl)ethyl methacrylate (IV), dihydroanthracene, dibenzo(h,k)-4-oxatricyclo (5.2.2.02,6)undec-8, 10-diene-3,5-dione, 7-propyliso-9-oxo-10-thia-9,10-dihydroanthracene-2-yldi-p-tolylsulfonium, 7-propyliso-9-oxo-10-thia-9,10-dihydroanthracene-2-yldiphenylsulfonium, 2-(9,10-dihydro-10-oxo-9-anthracenyl)succinic anhydride, or the like, or a combination thereof.

When the sensitizing group is not part of a polymer, the first polymer comprises repeat units that have an acid labile group (but does not contain repeat units that have sensitizing groups since the sensitizing group is contained in the underlayer composition as a separate ingredient). Polymers containing repeat units having acid labile groups have been detailed above and will not be detailed here in the interests of brevity. The small molecule containing the sensitizing group may be present in an amount of 0.1 to 15 wt % or 1 to 10 wt %, based on the weight of total solids.

The underlayer composition may also contain a solvent. The solvent is used to solvate the solids used in the underlayer composition and to facilitate miscibility of the various ingredients used in the composition. It will be understood that "polymer" used in this context of a component in the underlayer may mean only the polymers or copolymers disclosed herein, or a combination of the polymer or copolymer and the compound that contains the sensitizing group useful in the underlayer. It will be understood that total solids includes the polymer or copolymer, the compound that contains the sensitizing group, a photo destroyable base, a quencher, a surfactant, any optionally added PAG, and any optional additives, exclusive of solvent.

Solvents generally suitable for dissolving, dispensing, and coating include anisole, alcohols including 1-methoxy-2-propanol (also referred to as propylene glycol methyl ether, PGME), and 1-ethoxy-2 propanol, esters including n-butyl acetate, 1-methoxy-2-propyl acetate (also referred to as propylene glycol methyl ether acetate, PGMEA), methoxyethyl propionate, ethoxyethyl propionate, ketones including cyclohexanone, 2,6-dimethyl-4-heptanone, 2 heptanone; ethyl lactate (EL), 2-hydroxyisobutyric acid methyl ester (HBM), gamma-butyrolactone (GBL), 3-methoxypropanoic acid methyl ester, and combinations thereof.

The solvent amount can be, for example, 50 to 99.5 wt %, preferably 70 to 99 wt %, and more preferably 90 to 98 wt %, based on the total weight of the underlayer composition.

The underlayer composition is applied to the first metal layer 102 to form the underlayer 104. The underlayer composition is generally applied upon a surface of the metal layer via spin-coating, dipping, roller-coating or some other conventional coating technique. Spin-coating is preferred. For spin-coating, the solids content of the coating solution can be adjusted to provide a desired film thickness based upon the specific coating equipment utilized, the viscosity of the solution, the speed of the coating tool and the amount of time allowed for spinning. In an embodiment, the underlayer composition is applied in a single application.

The underlayer composition may then be soft baked to produce the underlayer 104, typically by heating it to a temperature of 120 to 210° C. for a period of 1 to 6 minutes. The soft baking minimizes the solvent content in the film, thereby forming a tack-free underlayer 104 with improved adhesion to the first metal layer 102. The soft-bake can be conducted on a hotplate or in an oven, with a hotplate being typical.

The underlayer 104 (after the soft bake) typically has a first thickness of up to 500 nanometers (nm), preferably up to 300 nm, and more preferably up to 200 nm. In an embodiment, the underlayer has a thickness of 5 to 100 nm or 10 to 50 nm. The underlayer composition is disposed on the metal layer.

The Photoresist Layer

FIG. 1C depicts a photoresist layer 106 disposed on the underlayer 104. The photoresist layer is obtained from a photoresist composition that comprises a photoacid generator and a second polymer comprising an acid-labile group. The photoresist layer has a second thickness that is different from the first thickness of the underlayer.

To remove footing that is present in the underlayer and the photoresist layer a higher photo-acid concertation at substrate interface is favorable. Since the underlayer comprises a sensitizing group and is devoid of a photoacid generator, the photoacid concentration at an interface between the photoresist layer and the underlayer is increased when the photoresist layer alone contains a photoacid generator. The photoresist layer does not contain a UV sensitizer since its presence (in the photoresist layer) will weaken the effect of the UV sensitizing group at the interface with the underlayer.

The photoresist composition comprises a second polymer that comprises an acid-labile group. The second polymer is devoid of a sensitizing group. Acid labile polymers are described above and will not be detailed again in the interests of brevity.

Typically, the second polymer is present in the photoresist composition in an amount of from 70 to 99.5 wt % based on total solids of the photoresist composition. The weight average molecular weight $M_w$ of the second polymer is typically less than 100,000, for example, from 4,000 to 100,000, more typically from 8,000 to 25,000 grams per mole (g/mole) as measured by gel permeation chromatography using a polystyrene standard.

The photoresist composition comprises a non-ionic photoacid generator. In an embodiment, the photoresist composition may optionally contain an ionic photoacid generator. It is desirable to use photoacid generators that generate the photoacid by a Norrish-1 cleavage. The Norrish-I reaction is the photochemical cleavage or homolysis of aldehydes and ketones into two free radical intermediates. The carbonyl group accepts a photon and is excited to a photochemical singlet state. In an embodiment, the photoacid generator has the structure shown in formula (8)

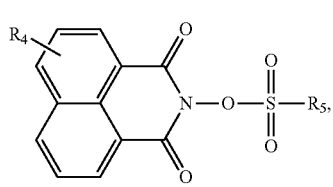

(8)

wherein in formula (8), $R_4$ is a hydrogen atom, a substituted or unsubstituted, linear or branched $C_1$ to $C_{14}$ alkyl group, a substituted heterocyclic group, or a halogen atom; and wherein $R_5$ is a substituted or unsubstituted alkyl group having 1 to 18 carbon atoms; a halogen atom, or an aryl group having 6 to 20 unsubstituted carbon atoms.

Examples of suitable photoacid generators are N-hydroxynaphthalimide trifluoromethanesulfonate (NHNI-TF), N-hydroxynaphthalimide perfluoro-1-butanesulfonate (NHNI-PFBS), N-hydroxynaphthalimide camphor-10-sulfonate, N-hydroxynaphthalimide 2-trifluoromethylphenylsulfonate, N-hydroxy-5-norbornene-2,3-dicarboximide perfluoro-1-butanesulfonate, N-(trifluoromethylsulfonyloxy)phthalimide, N-hydroxysuccinimide perfluorobutanesulfonate or benzeneacetonitrile, 2-methyl-α-[2-[[(propylsulfonyl)oxy]imino]-3(2H)-thienylidene]-(commercially available as IRGACURE PAG 103). In a preferred embodiment, the photoacid generator may be one or more of the structures of formulas (9a), (9b) or (9c) shown below

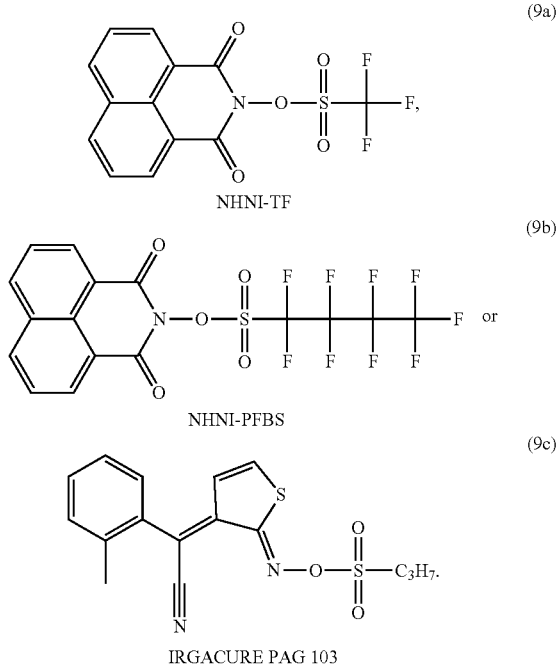

The photoacid generator is present in the photoresist composition in an amount of from 0.2 to 15 wt %, more typically 0.3 to 5 wt %, and more preferably 0.5 to 2 wt %, based on total solids of the photoresist composition. By minimizing photoacid generator loading, UV transparency of the photoresist also can be minimized. It increases UV transparency of photoresist layer. Then enough UV irradiation that through the photoresist layer may reach the UV sensitizer in the underlayer.

The photoresist composition further comprises a solvent. The solvents used in the photoresist composition may be the same or different from those used in the underlayer. The solvents are listed above and will not be listed again in the interests of brevity. The solvent amount can be, for example, 20 to 95 wt %, preferably 40 to 80 wt %, and more preferably 50 to 70 wt %, based on the total weight of the photoresist composition.

The photoresist composition can comprise other optional ingredients, such as one or more surface leveling agent (SLA), adhesion promoter and/or plasticizer. If used, the SLA is preferably present in an amount of from 0.001 to 0.1 wt % based on total solids of the photoresist composition, and the adhesion promoter and/or plasticizer each in an amount of from 0.1 to 10 wt % based on total solids of the photoresist composition.

In accordance with a patterning process, a layer of the photoresist composition is formed on a substrate. The composition can be applied to the substrate by spin-coating, dipping, roller-coating or other conventional coating technique. Spin-coating is preferred. For spin-coating, the solids content of the coating solution can be adjusted to provide a desired film thickness based upon the specific coating equipment utilized, the viscosity of the solution, the speed of the coating tool and the amount of time allowed for spinning. In an embodiment, the layer of the photoresist composition is applied in a single application.

The photoresist composition layer can next be soft-baked to minimize the solvent content in the film, thereby forming a tack-free coating and improving adhesion of the layer to the substrate. The soft-bake can be conducted on a hotplate or in an oven, with a hotplate being typical.

The photoresist composition may be disposed on the underlayer either after the soft bake of the underlayer composition or prior to it. In an embodiment, it is disposed on the underlayer after the soft bake of the underlayer composition has occurred. The photoresist composition may also be subjected to a soft bake at a temperature of 90 to 140° C. for a time of 1 to 6 minutes to remove the solvent contained in the photoresist composition. The photoresist composition forms the photoresist layer after the removal of the solvent. The photoresist layer has a thickness of 1 to 50 micrometers, preferably 2 to 20 micrometers. In an embodiment, the ratio of thickness of the photoresist layer to the underlayer is 1000:1 to 20:1.

The photoresist composition layer is then patternwise exposed to activating radiation through a photomask to create a difference in solubility between exposed and unexposed regions. With reference to the FIG. 1C, after coating the photoresist layer 106, the photoresist layer 106 and the underlayer 104 are exposed to activating radiation 108 through a photomask 110. A source of activating radiation having a wavelength of 10 to 500 nanometers may be used in the photopatterning. The exposed portions of the photoresist layer 106 and the underlayer 104 are developed, for example, with a suitable alkaline developer as seen in the FIG. 1D.

References herein to exposing a photoresist composition layer to radiation that is activating for the layer indicates that the radiation is capable of forming a latent image in the layer. The photomask has optically transparent and optically opaque regions corresponding to regions of the resist layer to be exposed and unexposed, respectively, by the activating radiation. The exposure wavelength is typically sub-500 nm, such as 365 nm, 248 nm, 193 nm, or EUV wavelength. Preferably, the exposure is conducted with radiation of 365 nm wavelength from a mercury lamp (i-line).

Following exposure of the photoresist composition layer, a post exposure bake (PEB) is typically performed to decompose the acid labile group by acid that generated from the PAG during the exposure step. The PEB can be conducted, for example, on a hotplate or in an oven. A latent image defined by the boundary between polarity-switched and unswitched regions (corresponding to exposed and unexposed regions, respectively) is thereby formed.

The photoresist composition layer is next contacted with an alkaline developing solution to remove exposed portions of the layer, leaving unexposed regions forming a resist pattern. The developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH).

As may be seen in the FIGS. 1D and 1E (which represents an expanded view of the dashed section of the FIG. 1D), the height $h_2$ of the undercut region as measured from an upper surface of the metal layer 102 is greater than a thickness $h_1$ of the underlayer. Following the removal of the exposed regions, the patterned photoresist layer 106' and underlayer 104' are formed on the substrate. The removal of the exposed portions of the photoresist layer and the underlayer results in openings to first metal layer 102 into which metal structures, for example, lines or pillars, can be plated.

Figure 1F:
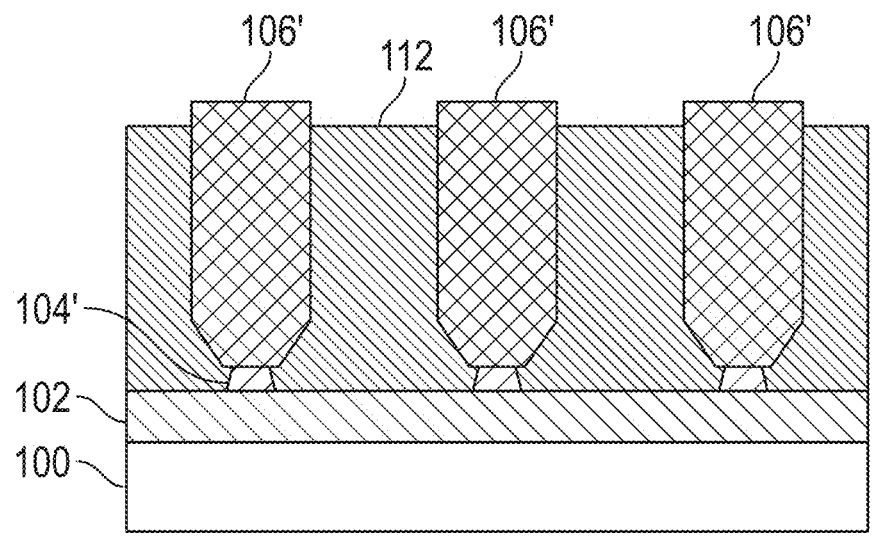
FIG. 1F is an exemplary depiction of the deposition of metal (via plating) on the metal layer.

A further aspect is a process for depositing a metal on a metal layer 102. FIG. 1F is an exemplary depiction of the deposition of metal (via plating) on the metal layer 102. The process typically includes immersing the metal layer in a metal plating solution and electro depositing a metal 112 on the metal layer 102 in the exposed portions of the photoresist composition layer. The developed regions of the underlayer and photoresist composition layer function as a mold for the metal plating. The metal can be plated, for example, by electroplating. Various types of metal plating solutions known in the art can be used. Also, two or more different layers of metal can be formed, and the layers can be of the same or different metals. Preferable plated metals include, but are not limited to, copper, nickel, tin, silver, gold and mixtures and alloys thereof. Suitable metal plating solutions for use in forming such metals are known in the art and are commercially available from DuPont Electronics & Industrial. The thickness of the plated metal layer is typically from 1 to 100 micrometers, preferably from 5 to 50 micrometers or from 10 to 50 micrometers.

Figure 1G:
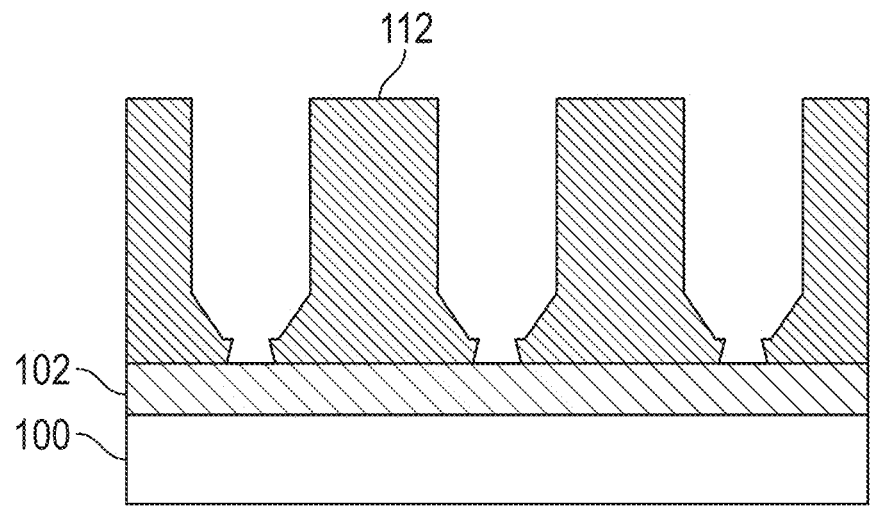
FIG. 1G depicts the plated metal structures left behind after removal of the remaining photoresist layer and underlayer.

After metal plating, the remaining photoresist layer and underlayer can be removed (stripped) from the substrate to leave behind the plated metal features 112. FIG. 1G depicts the plated metal features 112 left behind after removal of the remaining photoresist layer and underlayer. Suitable photoresist strippers are commercially available, for example, Shipley BPR™ Photostripper (DuPont Electronics & Industrial).

Regions of the exposed first metal layer 102 between the plated metal features 112 can optionally be removed, for example, by an etch-back process, to electrically isolate each of the plated metal features. The obtained metal features can take the form, for example, of lines or pillars. Metal features having small widths/diameters can be formed by the compositions and methods disclosed herein. Such structures find use, for example, in electrical connections in small, light and thin devices. The widths of the lines or fillet diameters can, for example, be from 0.8 to 10 micrometers, preferably from 1 to 3 micrometers. The height of the features will depend, for example, on the thickness of the photoresist composition resin, but heights of 2 micrometers or more can be formed.

This invention is advantageous in that the photoresist composition and the underlayer composition may be used to obtain metal features with a larger cross-sectional area at the base when compared with the cross-sectional area at the top of the features. The use of the disclosed underlayer composition and the photoresist composition prevents the formation of an undercut at the bottom of the metal features. This prevents collapse of the metal features during further processing of the semiconductor devices.

The invention will now be exemplified by the following non-limiting examples.

EXAMPLES

Example 1

This example details the manufacture of the first polymer for use in an underlayer composition. The underlayer composition comprises a polymer (the first polymer) obtained from the following monomers. As noted above, the first polymer contains repeat units that have sensitizing groups and repeat units that have acid labile groups.

ANTMI is the reaction product of 9-anthracene-methyl methacrylate (ANTMA) and maleimide (MI). HNMA is a reaction product of 6-hydroxy-2-naphthoic acid and 2-hydroxy ethyl methacrylate. Either monomer can be prepared by known methods detailed, for example in US Patent Publication No. 20110003250A. Other monomers can be obtained from commercial sources. For example, ANTMA (9-anthracene-methyl methacrylate, CAS: 31645-35-9) can be obtained from Tokyo Chemical Industries, co., LTD., TBA (tertiary butyl acrylate CAS: 1663-39-4 can be obtained from Tokyo Chemical Industries, co., LTD), MI (maleimide CAS: 541-59-3 can be obtained from Tokyo Chemical Industries, co., LTD.).

The polyhydroxystyrene (PHS) repeat unit on the UL-A3 polymer is converted after polymerization from acetoxy styrene.

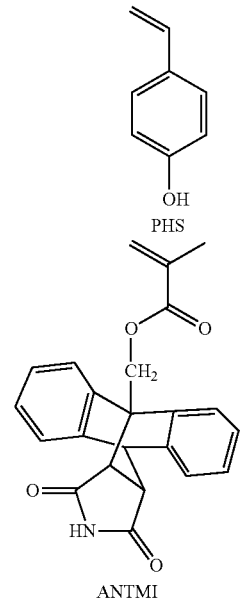

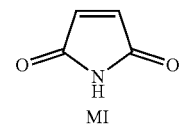

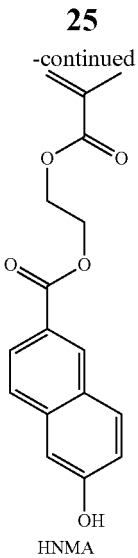

HNMA

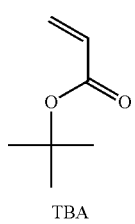

TBA

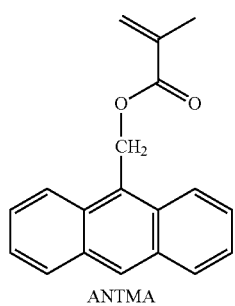

ANTMA

Three different first polymers (UL-A1, UL-A2 and UL-A3) were manufactured using different combinations of the monomers displayed above. The amount of the respective monomers (in mol %) in the first polymer in the underlayer composition is shown in the Table 1 below.

TABLE 1

| ID | UL-Aa<br>ANTMA<br>(mol %) | UL-Ab<br>TBA<br>(mol %) | Other recurring unit | | | | Mw<br>(g/mol) |
|---|---|---|---|---|---|---|---|
| | | | HNMA<br>(mol %) | ANTMI<br>(mol %) | MI<br>(mol %) | PHS<br>(mol %) | |
| UL-A1 | 8 | 10 | 44 | 30 | 8 | — | 11000 |
| UL-A2 | 8 | 6 | 53 | 26 | 7 | — | 11000 |
| UL-A3 | 21 | 12 | — | — | — | 67 | 9800 |

Example 2

This example details different underlayer compositions manufactured from the first polymer of Example 1. Table 2 details 6 different underlayer compositions (UL1-UL6) in parts per hundred (phr). It may be noted that two of the underlayer compositions (UL1 and UL6) contained photoacid generators. The PAG used in UL1 does not have UV absorbance on i-line wavelengths. It also does not contain the anthracene UV sensitizing group. It is believed that the PAG acts as dissolution inhibitor/controller of underlayer polymer. PAG P2 used in UL6 is i-line sensitive and was sensitized by anthracene.

The solids content for all compositions was 2.2 wt % except for UL4 which was 3.5 wt %. UL5 used PGMEA (propylene glycol 1-methyl ether 2-acetate CAS:108-65-6) as solvent. Other UL examples used ethyl lactate (CAS: 97-64-3).

TABLE 2

| | UL-A1 | UL-A2 | UL-A3 | PAG P1 | PAG P2 | Solvent | Solid Content [wt %] |
|---|---|---|---|---|---|---|---|
| UL1 | 30 | 70 | | 1.5 | | EL | 2.2 |
| UL2 | 100 | | | | | EL | 2.2 |
| UL3 | | 100 | | | | EL | 2.2 |
| UL4 | 100 | | | | | EL | 3.5 |
| UL5 | | | 100 | | | EL | 2.2 |
| UL6 | 30 | 70 | | | 1.3 | EL | 2.2 |

The structures for photoacid generators PAG P1 and P2 are shown below.

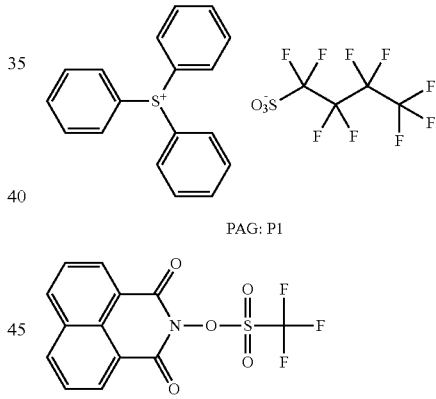

PAG: P1

PAG: P2

As a comparative example, UL7 (CI1305-10) was prepared as follows. Alkaline soluble resin-A (35 (parts by weight—(pbw))) and its partially protected compound by DNQ (Diazo naphthoquinone sulfonic acid (65 pbw) was dissolved in 950 pbw of PGMEA (solids content=5 wt %)

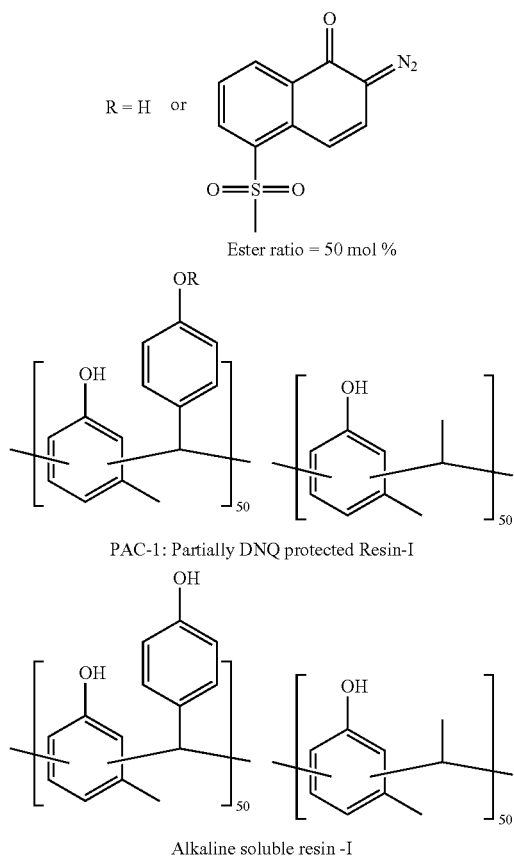

PAC-1: Partially DNQ protected Resin-I

Alkaline soluble resin -I

Example 3

This example details the manufacturing of the second polymer (polymers D, E, F, G and H) that was used in the photoresist composition. Table 3 depicts the amounts of the various monomers (in mol %) used in the preparation of second polymer. The structures of the various monomers used in the second polymer are shown below. As detailed above, the second polymer contains repeat units that have an acid labile group. The second polymer does not contain any repeat units that have sensitizing groups.

TABLE 3

| | TBA (mol %) | ECPMA (mol %) | PHS-EE (mol %) | STY (mol %) | PHS (mol %) | Mw (g/mol) |
|---|---|---|---|---|---|---|
| D | 35 | | | | 65 | 23,000 |
| E | | 21 | | 9 | 70 | 12,000 |
| F | 24 | | 20 | | 56 | 24,000 |
| G | 20 | | | 10 | 70 | 21,000 |
| H | 15 | | | 20 | 65 | 12,000 |

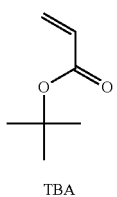

TBA

TABLE 3-continued

| TBA (mol %) | ECPMA (mol %) | PHS-EE (mol %) | STY (mol %) | PHS (mol %) | Mw (g/mol) |
|---|---|---|---|---|---|

ECPMA

PHS-EE

STY

PHS

Example 4

This example depicts photoresist compositions that contain the second polymer and a photoacid generator. Table 4 shows the photoresist compositions and the amount in parts per hundred for each component. The structures for the photoacid generators (PAG P2 and P3) and bases (Base-a and Base-b) are shown below the Table 4. SLA indicates "self levelling agent". The solvent was present in 100 parts and contained 98 parts of PGMEA and 2 parts of gamma-butyrolactone (GBL).

TABLE 4

| ID | Polymer | Solvent | PAG P2 | PAG P3 | Base-a | Base-b | SLA-A | PGMEA/GBL | Solid Content [wt %] |
|---|---|---|---|---|---|---|---|---|---|
| PR1 | D | 100 | 1.3 | | 0.16 | 0.03 | 0.02 | 98/2 | |
| PR2 | E | 100 | 1.3 | | 0.16 | 0.03 | 0.02 | 98/2 | 34.0 |
| PR3 | F | 100 | 1.3 | | 0.16 | 0.03 | 0.02 | 98/2 | 34.0 |
| PR4 | G | 100 | 1.3 | | 0.16 | 0.03 | 0.02 | 98/2 | 34.0 |
| PR5 | D | 100 | | 1.86 | 0.16 | 0.03 | 0.02 | 98/2 | |
| PR6 | H | 100 | 1.3 | | 0.16 | 0.03 | 0.02 | 98/2 | |

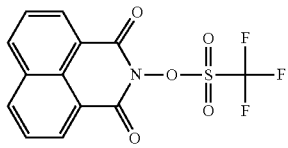

PAG: P2

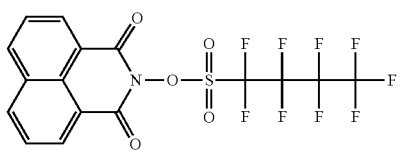

PAG: P3

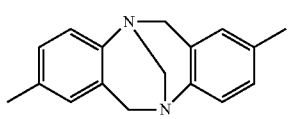

Base-a

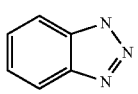

Base-b

Example 5

This example depicts the formation of the first metal layer and the second metal layer on the substrate. The first layer comprised copper. 200 nm of copper was deposited by PVD on a silicon substrate. Prior to copper deposition, 150 nm of titanium layer was deposited on the silicon substrate for passivation and adhesion purposes. The copper coated substrate was dipped in 10 wt % of $H_2SO_4$ for 30 seconds followed by a deionized water (DIW) rinse and drying in a stream of nitrogen. A 60 second puddle of 2.38 wt % TMAH developer followed by a spinning DIW (de-ionized water) rinse and drying is used for neutralization of residual acid by a basic chemical.

Example 6

This example details the processing conditions for manufacturing the underlayer and the photoresist layer. The substrate was a silicon substrate with a first metal layer that comprises titanium and a second metal layer that comprises copper. No primer was disposed on the copper surface. The underlayers (UL1 to UL5) are shown in the Table 5 below.

The underlayer was baked (soft bake) at 170, 185 and 200° C. for 60 second at each temperature. There were two underlayer thicknesses of 54 nm and 110 nm. The photoresist layers were manufactured from 6 photoresist compositions PR1-PR6. The photoresist layers were subjected to a soft bake at 135° C. for 90 seconds to remove solvent. The photoresist layers have a thickness of 8 to 7.5 micrometers.

After the soft bake, the substrate was exposed by an i-line exposure tool (NSR-2005i9C, NIKON) that has 0.50 NA and 0.68 PC lens setting.

The post exposure bake takes place at 110° C. for 90 seconds. Then the substrate was developed in an aqueous developer, MF™ CD-26 developer (DuPont Electronics & Industrial), 2.38 wt % TMAH (tetramethyl ammonium hydroxide: CAS:75-59-2) for 80 seconds of single puddle and static development. Single puddle means no additional fresh developer was supplied during development. And static development implies that there is no agitation such as by spinning and stopping at low spin speed.

Table 5 below shows the various double layers manufactured by the method detailed above.

TABLE 5

| UL Name | Polymer of UL | PAG in UL | Substrate | Bake UL [° C.] | FT UL [nm] | FT PR [μm] | PR Name | Polymer of PR | PAG in PR |
|---|---|---|---|---|---|---|---|---|---|
| Ex-1 | UL1 | UL-A1/UL-A2 | P1 | Cu | 185 | 54 | 8.0 | PR1 | D | P2 |
| Ex-2 | UL1 | UL-A1/UL-A2 | P1 | Cu | 170 | 54 | 8.0 | PR1 | D | P2 |
| Ex-3 | UL1 | UL-A1/UL-A2 | P1 | Cu | 200 | 54 | 8.0 | PR1 | D | P2 |
| Ex-4 | UL1 | UL-A1/UL-A2 | P1 | Cu | 185 | 54 | 8.0 | PR1 | D | P2 |
| Ex-5 | UL2 | UL-A1 | None | Cu | 185 | 54 | 8.0 | PR1 | D | P2 |
| Ex-6 | UL3 | UL-A2 | None | Cu | 185 | 54 | 8.0 | PR1 | D | P2 |
| Ex-7 | UL4 | UL-A1 | None | Cu | 185 | 110 | 8.0 | PR1 | D | P2 |
| Ex-8 | UL5 | UL-A3 | None | Cu | 185 | 54 | 8.0 | PR1 | D | P2 |
| Ex-9 | UL1 | UL-A1/UL-A2 | P1 | Cu | 185 | 54 | 8.0 | PR2 | E | P2 |
| Ex-10 | UL1 | UL-A1/UL-A2 | P1 | Cu | 185 | 54 | 8.0 | PR3 | F | P2 |
| Ex-11 | UL1 | UL-A1/UL-A2 | P1 | Cu | 185 | 54 | 8.0 | PR4 | G | P2 |
| Ex-12 | UL1 | UL-A1/UL-A2 | P1 | Cu | 185 | 54 | 8.0 | PR5 | D | P3 |
| EX-13 | UL6 | UL-A1/UL-A2 | P1 | Cu | 185 | 54 | 7.5 | PR1 | D | P2 |
| EX-14 | UL1 | UL-A1/UL-A2 | P1 | Si | 185 | 54 | 8.0 | PR-1 | D | P2 |
| CF-1 | None | — | — | Cu | — | — | 8.0 | PR6 | H | P2 |
| CF-2 | None | — | — | Cu | — | — | 8.0 | PR4 | G | P2 |
| CF-3 | None | — | — | Cu | — | — | 8.0 | PR1 | D | P2 |
| CF-4 | UL7 | Resin-1 | PAC-1 | Si | 135 | 70 | 8.0 | PR-1 | D | P2 |

Example 7

This example was conducted to determine the pattern profile obtained from the compositions of Example 6. Pattern profile of the photoresist was evaluated at an exposure energy that produced 1.5 μm of space width at the central focus (Eop). Table 7 shown in FIG. 2 depicts that pattern profile of photoresist using this invention.

No footing was observed through 170-200° C. of underlayer bake temperature at E" (Examples 1-3). The footing profile did not occur even if lower exposure energy was used (Example 4). A small undercut was observed on these examples. Using a photoresist pattern that produces the undercut profile will produce a plated pattern that has a footing profile. The presence of the footing profile prevents pattern collapse of the plated pattern after the photoresist is removed. Measured undercut width are 0.2 to 0.3 μm and undercut height were thicker than μm. This is more than 7 times thicker than coating thickness of the underlayer.

Example 8

This example was conducted to demonstrate the use of underlayer formulations without the use of photoacid generator. Table 8 in FIG. 3 depicts pattern profiles for a number of examples that have underlayer formulations without the photoacid generator.

Examples 5 and 6 (Ex-5 and Ex-6) both used UL-A that has the same ANTMA composition. UL-A1 that is used in UL2 contained a higher amount of maleimide (MI) and ANTMI than UL-A2. By comparing the dissolution rates of UL-A1 and UL-A2 in an aqueous developer, it was determined that UL-A1 gave a faster dissolution rate. It is believed that the imide structure allows for a faster dissolution rate in alkaline developer. Both Examples 5 and 6 gave a small undercut profile. By comparing the undercut width of Example 5 with 6 it may be seen that Example 5 gave a slightly shorter width. This result indicates that the mechanism of undercutting may not be dependent only upon the dissolution rate. Since these examples do not use PAG, the proposed process works without PAG in the underlayer composition. Example 7 used a greater film thickness than Example 5. Both examples (5 and 7) showed no footing and had a very low undercut profile. Example 8 uses another UL-A composition that had a higher content of ANTMA and TBA. It indicated a larger height for the undercut, but there was no footing.

Table 9 in FIG. 4 shows pattern profiles obtained when the photoacid generator contained another first polymer and PAG. Example-9 and 12 used a styrene inert group and low leaving group composition. Example-9 further used another acryl type leaving group. Example-10 used a combination of an acrylic type and an acetal type leaving group. Neither polymer example showed any footing but had a small undercut profile. Undercut height for these examples were more than 9 times thicker than coating thickness of the underlayer.

Example 12 that uses another PAG also gave no footing.

Figure 5:
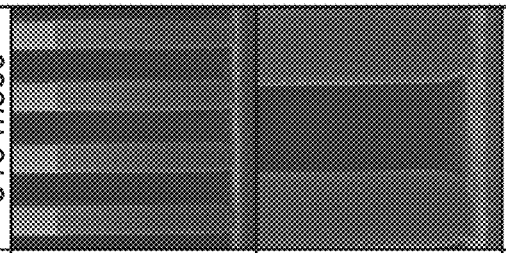

Table 10 in FIG. 5 showed a pattern profile obtained for the double layer process by using an underlayer that has i-line sensitive PAG added to the UL at 7.5 μm of photoresist film thickness. Example-13 showed an undercut profile. This result denotes that the addition of PAG into the underlayer does not interfere with the effect of this invention, i.e., the amount of PAG does not interfere with the UV absorbance of sensitizer.

Example 9

This example details comparative Examples (CF-1, CF-2 And CF-3) and demonstrates the difference between a double layer process and a single layer process where the photoresist layer is the only layer on the substrate. Table 11 in FIG. 6 shows a single layer example. The footing profile was reduced by adding benzotriazole but a small footing remains on the copper surface. This gives an undercut on plated pattern that may affect pattern collapsing during further process.

Example 10

This is a comparative example (CF-4) where the underlayer does not contain a UV sensitizer. UL-7 used a cresol novolac resin where a portion of phenolic hydroxy group is protected by diazo naphthoquinone that can be decomposed by the i-line wavelength. To prevent thermal decomposition of diazo naphthoquinone, a lower bake temperature than that which was used in UL-1 was applied. The data is shown in the Table 12 (FIG. 7). It gave a tailing profile on silicon substrate. It may give a larger footing on copper.

In summary, from the aforementioned examples, the dual layer process gives an undercut pattern profile that has a thicker undercut height than the thickness of the underlayer. This may be seen in multiple photoresist examples that use a variety of leaving groups. The undercut profile is independent of the dissolution rate of the polymer in the underlayer and the bake temperature. The undercut occurs with and without addition of PAG.

It may be seen that localization of the photoacid concentration at an interface of the underlayer and the photoresist layer produces an undercut pattern profile that has a thicker undercut height than the thickness of the underlayer. UV sensitizing to PAG in the photoresist might occur via the use of an anthracene moiety in the underlayer. By applying a post exposure bake, highly condensed photoacid diffuses to an upper or non-exposed area that facilitates the development of an undercut pattern profile.

What is claimed is:

1. A metallization method, comprising:
   (a) forming on a first surface of a substrate an underlayer from an underlayer composition comprising: a first polymer comprising an acid-labile group, and a sensitizing group, wherein the sensitizing group is a polycyclic aromatic group, and wherein the first polymer comprises the sensitizing group; wherein the underlayer has a first thickness;
   (b) forming on the underlayer a photoresist layer from a photoresist composition comprising: a second polymer comprising an acid-labile group, and a photoacid generator; wherein the photoresist layer has a second thickness;
   (c) pattern-wise exposing the photoresist layer to activating radiation;
   (d) developing the exposed photoresist layer with a basic developer, thereby removing portions of the photoresist layer and portions of the underlayer to form a relief pattern, wherein the relief pattern has an undercut profile at the first surface, wherein a maximum height of an undercut in the relief pattern measured from the first surface is greater than the first thickness; and
   (e) after forming the relief pattern, plating a metal on the first surface of the substrate.

2. The metallization method of claim 1, further comprising (f) removing the photoresist and underlayer after plating the metal.

3. The metallization method of claim 1, wherein the sensitizing group is an anthracene or anthracene-derivative group.

4. The metallization method of claim 1, wherein the underlayer composition is free of photoacid generators.

5. The metallization method of claim 1, wherein the first thickness is 200 nm or less.

6. The metallization method of claim 1, wherein a ratio of the first thickness to the second thickness is less than 0.01.

7. The metallization method of claim 1, wherein the acid-labile group of the first polymer and the acid-labile group of the second polymer are independently a tertiary ester group or an acetal group.

8. The metallization method of claim 1, wherein the second polymer comprises a repeat unit formed from a vinyl aromatic monomer.

* * * * *